United States Patent [19]

Ishibashi et al.

[11] Patent Number: 5,793,727
[45] Date of Patent: Aug. 11, 1998

[54] ARRAY DISK SYSTEM AND METHOD OF WRITING AND READING DATA IN ARRAY DISK SYSTEM

[75] Inventors: Kazuhiko Ishibashi, 194, Sasanodai, Asahi-ku, Yokohama-shi, Kanagawa, 241; Tomohisa Ohyama, 2-8-12, Sagamidai, Sagamihara-shi, Kanagawa, 228, both of Japan

[73] Assignees: Kazuhiko Ishibashi, Yokohama; Tomohisa Ohyama, Sagamihara, both of Japan

[21] Appl. No.: 395,525

[22] Filed: Feb. 27, 1995

Related U.S. Application Data

[63] Continuation of Ser. No. 559,038, Jul. 30, 1990, abandoned.

[30] Foreign Application Priority Data

Aug. 2, 1989 [JP] Japan .................................. 1-199217

[51] Int. Cl.⁶ ...................................................... G11B 7/00
[52] U.S. Cl. .................................. 369/53; 360/22; 360/53
[58] Field of Search ............................. 369/54, 48, 58, 369/49, 59, 53; 360/24, 47, 22, 25, 40, 98.01, 98.03, 98.08, 39, 53; 364/900, 967, 968, 970, 200 MS File, 900 MS File; 371/10.1, 10.2, 8.1, 40.2

[56] References Cited

U.S. PATENT DOCUMENTS

| 4,498,146 | 2/1985 | Martinez ................................ 369/58 |
| 4,558,446 | 12/1985 | Banba et al. . | |
| 4,742,507 | 5/1988 | Kuroki et al. ........................... 369/54 |
| 4,774,700 | 9/1988 | Satoh et al. ............................. 369/54 |
| 4,817,035 | 3/1989 | Timsit .................................. 360/98.01 |
| 4,849,956 | 7/1989 | Aizawa ..................................... 369/58 |
| 4,885,735 | 12/1989 | Fukushima et al. ....................... 369/54 |
| 5,075,804 | 12/1991 | Deyring ................................... 369/54 |
| 5,084,789 | 1/1992 | Kamo et al. .............................. 360/39 |
| 5,088,081 | 2/1992 | Farr ........................................ 369/58 |

FOREIGN PATENT DOCUMENTS

| 0073330 | 3/1983 | European Pat. Off. . |
| 0127732 | 12/1984 | European Pat. Off. . |
| 0156724 | 10/1985 | European Pat. Off. . |
| 55-108915 | 8/1980 | Japan . |
| 61-145767 | 7/1986 | Japan . |
| 62-80867 | 4/1987 | Japan . |
| 62-123922 | 6/1987 | Japan . |
| 62-141678 | 6/1987 | Japan . |
| 64-79974 | 3/1989 | Japan . |
| 1-178172 | 7/1989 | Japan . |

OTHER PUBLICATIONS

Patent Abstracts of Japan, vol. 8, No. 141, p–283, & JP 59–38930, Jun. 30, 1984.

*Primary Examiner*—W. R. Young
*Attorney, Agent, or Firm*—Armstrong, Westerman, Hattori, McLeland & Naughton

[57] ABSTRACT

An array disk system includes a plurality of disk units respectively having at least one disk for storing data and a head for writing the data on the disk, a control unit supplied with data for controlling write operations in which the data are simultaneously written to the disk units which are coupled to the control unit in parallel, and a non-volatile memory for storing data to be written into a defective block of the disk unit. The control unit writes the data into blocks of the disk units when the disk units are free of defective blocks, and writes the data to be written into the defective block of an arbitrary one of the disk units into the non-volatile memory when the arbitrary disk unit includes the defective block. The control unit also has a function of writing the data related to the defective block and stored in the non-volatile memory into the alternate block of the arbitrary disk unit during a free time of the arbitrary disk unit.

23 Claims, 16 Drawing Sheets

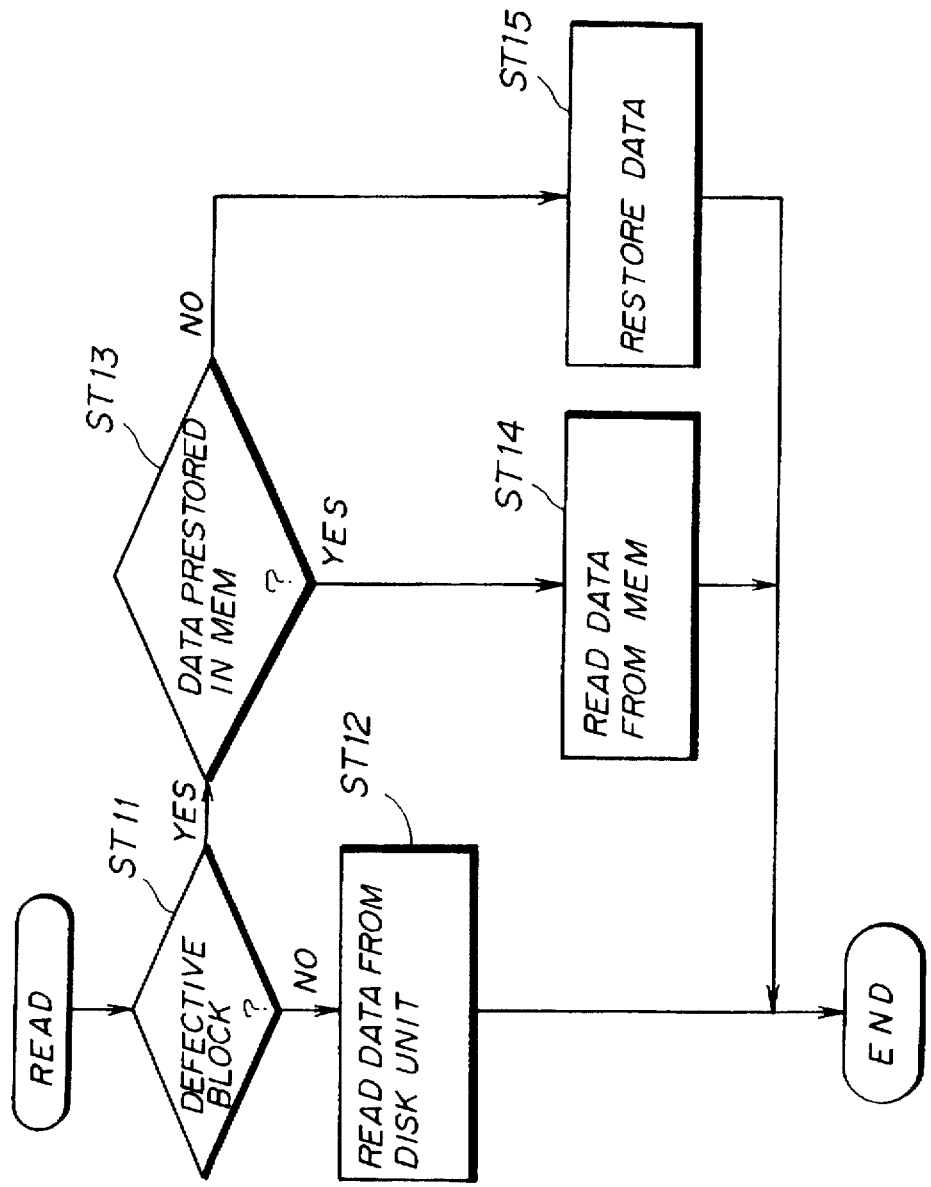

5,793,727

ARRAY DISK SYSTEM AND METHOD OF WRITING AND READING DATA IN ARRAY DISK SYSTEM

This application is a continuation of application Ser. No. 07/559,038 filed Jul. 30, 1990, now abandoned.

BACKGROUND OF THE INVENTION

The present invention generally relates to array disk systems, and more particularly to an array disk system which writes data to and reads data from a plurality of disk units in parallel. The present invention also relates to a method of writing and reading data in such an array disk system.

In order to cope with the high data processing speeds of recent information processing systems, there is a need to write data to and read data from a disk unit at a high speed. An array disk system shown in FIG. 1 was proposed to satisfy this need. This proposed array disk system includes a plurality of magnetic disk units which are coupled in parallel.

For example, the array disk system includes N magnetic disk units 10-11 through 10-1N for writing data and one magnetic disk unit 10-1N+1 for writing parity data, and an array disk controller 11. As shown in FIG. 2, data DATA1 through DATAN which are transmitted serially from a host unit (not shown) are written into the magnetic disk units 10-11 through 10-1N in parallel by the array disk controller 11. The array disk controller 11 produces the parity data used for carrying out a parity check on the data, and writes the parity data in the magnetic disk unit 10-1N+1.

In FIG. 1, the host unit regards the N+1 magnetic disk units such as the magnetic disk units 10-11 through 10-1N+1 as one set, and uses a combination of n such sets.

According to the array disk system shown in FIG. 1, it is possible to write data to and read data from the magnetic disk units at a high speed when compared to the conventional system in which the writing and reading of data are made with respect to a single magnetic disk unit. In FIG. 1, it is assumed for the sake of convenience that the array disk controller 11 is coupled to a plurality of input/output channels of the host unit.

In the proposed array disk system described above, there are cases where a defective block exists on a magnetic surface of the magnetic disk, and in such cases, data cannot be written into the detective block. The defective block of the magnetic disk is found when making the formatting of the magnetic disk. Hence, the data to be written into the defective block is written in an alternate area which is provided in a secondary area of the same magnetic disk, that is, the so-called alternate area assignment is made.

However, when the alternate area assignment is made, mechanical operations such as moving a magnetic head to the alternate area and positioning the magnetic head are required, and it takes time to prepare for the data transfer. As shown in FIG. 3, it takes time to make the data transfer corresponding to the alternate area assignment process. In the example shown in FIG. 3, it is assumed for the sake of convenience that a second block of a second magnetic disk unit DISK2 is the defective block. In this case, a time T1 required to move the magnetic head of the second disk unit DISK2 to an alternate area which actually stores the data which should originally be stored in the second block, and a time T2 is required to thereafter move the magnetic head from the alternate area to a third block. In other words, a time T1+T2 is additionally required when the alternate area assignment is made. The time delay caused by the alternate area assignment not only occurs when reading the data from the magnetic disk unit but also when writing the data to the magnetic disk unit.

Although the proposed array disk system can transmit the data at a high speed, there is a problem in that it is impossible to bring out the performance of the array disk system to the limit when the alternate area assignment is made.

SUMMARY OF THE INVENTION

Accordingly, it is a general object of the present invention to provide a novel and useful array disk system in which the problems described above are eliminated.

Another and more specific object of the present invention is to provide an array disk system comprising a plurality of disk units respectively having at least one disk for storing data and means for writing the data on the disk, where the disk has a recording surface which includes an alternate block when a defective block exists thereon, control means supplied with data for controlling write operations in which the data are simultaneously written to the disk units, where the disk units are coupled to the control means in parallel, and memory means coupled to the control means for storing data to be written into the defective block of the disk unit. The control means writes the data into blocks of the disk units when the disk units are free of defective blocks, and writes the data to be written into the defective block of an arbitrary one of the disk units into the memory means when the arbitrary disk unit includes the defective block. The control means includes means for writing the data related to the defective block and stored in the memory means into the alternate block of the arbitrary disk unit during a free time of the arbitrary disk unit. According to the array disk system of the present invention, there is no need to move a magnetic head to the alternate block of the disk unit during the normal write operation and no time delay is generated thereby.

Still another object of the present invention is to provide an array disk system comprising a plurality of disk units respectively having at least one disk which prestores data and parity data and means for reading the data from the disk, where the disk has a recording surface which includes an alternate block when a defective block exists thereon, memory means for prestoring data originally intended to be written in a defective block of the disk unit, and control means coupled to the disk units and the memory means for controlling read operations in which the data are simultaneously read from the disk units, where the disk units are coupled to the control means in parallel. The control means reads the data from blocks of the disk units when the disk units are free of defective blocks, and reads the data of the defective block of an arbitrary one of the disk units from the memory means when the arbitrary disk unit includes the defective block and the data of the defective block is prestored in the memory means. According to the array disk system of the present invention, it is possible to reduce the read-out time when the necessary data are prestored in the memory means.

A further object of the present invention is to provide a method of writing data in parallel in an array disk system which includes a plurality of disk units respectively having at least one disk for storing data and means for writing the data on the disk, where the disk has a recording surface which includes an alternate block when a defective block exists thereon, and the method comprises the steps of writing the data into blocks of the disk units when the disk units are free of defective blocks, writing the data to be written into the defective block of an arbitrary one of the disk units into memory means when the arbitrary disk unit includes the defective block, and writing the data related to the defective block and stored in the memory means into the alternate block of the arbitrary disk unit during a free time of the arbitrary disk unit. According to the method of the present invention, there is no need to move a magnetic head to the alternate block of the disk unit during the normal write operation and no time delay is generated thereby.

Another object of the present invention is to provide a method of reading data in parallel in an array disk system which includes a plurality of disk units respectively having at least one disk which prestores data and and parity data and means for reading the data from the disk, where the disk has a recording surface which includes an alternate block when a defective block exists thereon, and the method comprises the steps of prestoring data originally intended to be written in a defective block of the disk unit in memory means, reading the data from blocks of the disk units when the disk units are free of defective blocks, and reading the data of the defective block of an arbitrary one of the disk units from the memory means when the arbitrary disk unit includes the defective block and the data of the defective block is prestored in the memory means. According to the method of the present invention, it is possible to reduce the read-out time when the necessary data are prestored in the memory means.

Other objects and further features of the present invention will be apparent from the following detailed description when read in conjunction with the accompanying drawings.

BRIEF DESCRIPTION OF THE DRAWINGS

FIG. 5B is a flow chart for explaining the array disk system shown in FIG. 5A;

DESCRIPTION OF THE PREFERRED EMBODIMENTS

First, a description will be given of one aspect of an array disk system according to the present invention, by referring to FIGS. 4A and 4B.

Figure 4A:
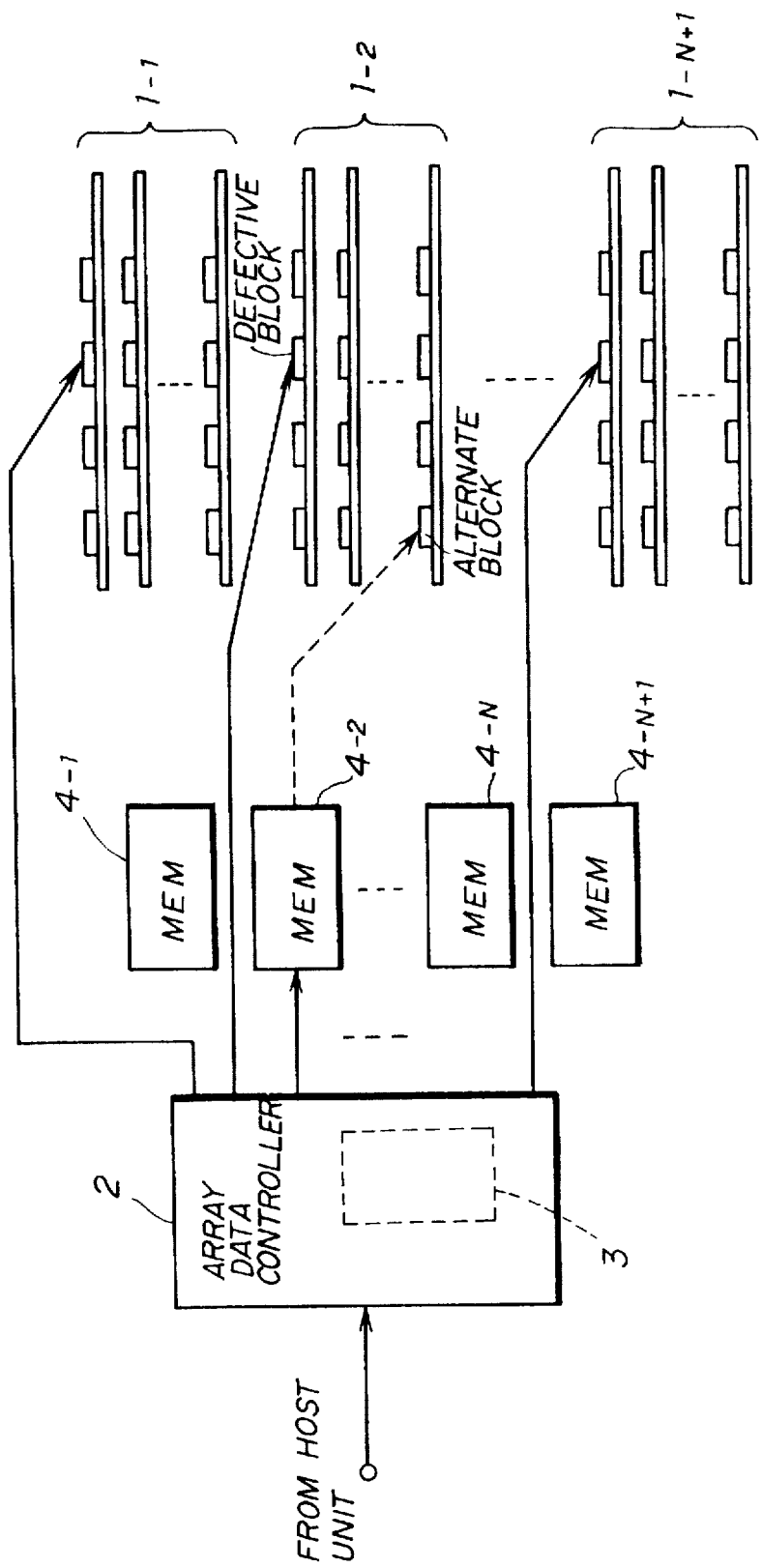
FIG. 4A is a system block diagram for explaining one aspect of an array disk system according to the present invention.

As shown in FIG. 4A, the array disk system includes disk units 1-1 through 1-N+1, an array data controller 2 and non-volatile memories 4-1 through 4-N+1 which are coupled as shown. The array data controller 2 distributes data from a host unit (not shown) in parallel to the disk units 1-1 through 1-N to be written therein. The array data controller 2 includes a parity data producing part 3 for producing parity data with respect to the data which are supplied in parallel to the disk units 1-1 through 1-N, and the parity data are stored in the disk unit 1-N+1. The non-volatile memories 4-1 through 4-N+1 are provided in correspondence with the disk units 1-1 through 1-N+1.

Figure 4B:
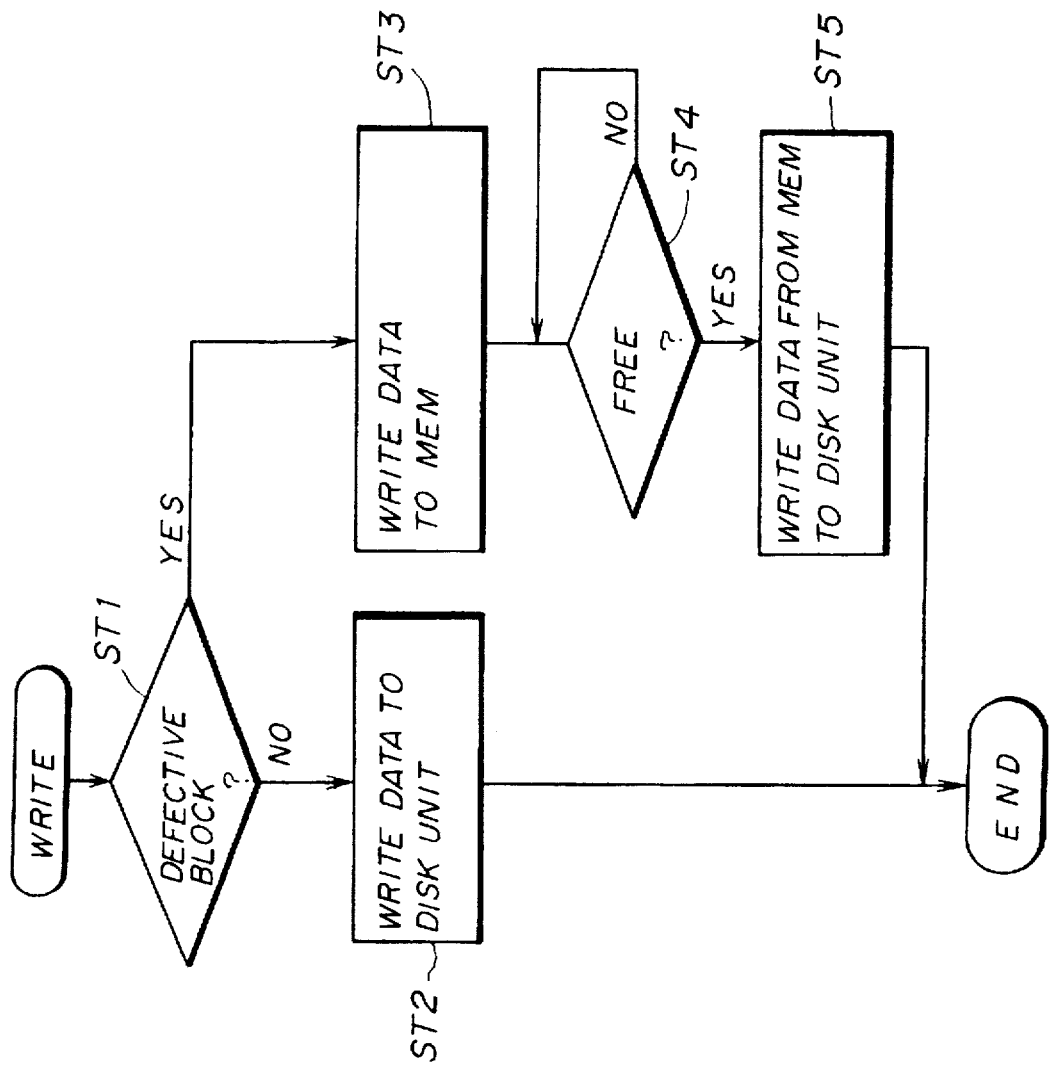
FIG. 4B is a flow chart for explaining the array disk system shown in FIG. 4A.

FIG. 4B is a flow chart for explaining an operation of the array data controller 2 shown in FIG. 4A. When a write operation starts, a step ST1 judges whether or not a defective block exists on a recording surface of the disk unit 1-i which is to store the data. When the judgement result in the step ST1 is NO, a step ST2 writes the data to the disk unit 1-i and the process ends.

On the other hand, when the judgement result in the step ST1 is YES, a step ST3 writes the data which originally is to be written in the defective block of the disk unit 1-i into the corresponding non-volatile memory 4-i and writes to the disk unit 1-i the data which is to be written in the non-defective block of the disk unit 1-i. Then, a step ST4 judges whether or not the disk unit 1-i is free, and a step ST5 writes the data which orignally is to be written in the defective block of the disk unit 1-i from the non-volatile memory 4-i into an alternate area of the disk unit 1-i during a free time of the disk unit 1-i when the judgement result in the step ST4 becomes YES. The process ends after the step ST5.

The process shown in FIG. 4A is carried out for i=1, 2, . . . , N, N+1.

Accordingly, even when a defective block exists on the recording surface of the disk unit when carrying out a write operation, the data originally to be written into the detective block is temporarily stored in the non-volatile memory. The data stored in the non-volatile memory is written into an alternate area of the disk unit during a free time of the disk unit, so as to prevent the time delay which would occur if the recording head were to move to the alternate area during the normal write operation. Therefore, the high-speed write operation of the array disk system will not be deteriorated by the alternate area assignment.

Next, a description will be given of another aspect of an array disk system according to the present invention, by referring to FIGS. 5A and 5B.

Figure 5A:
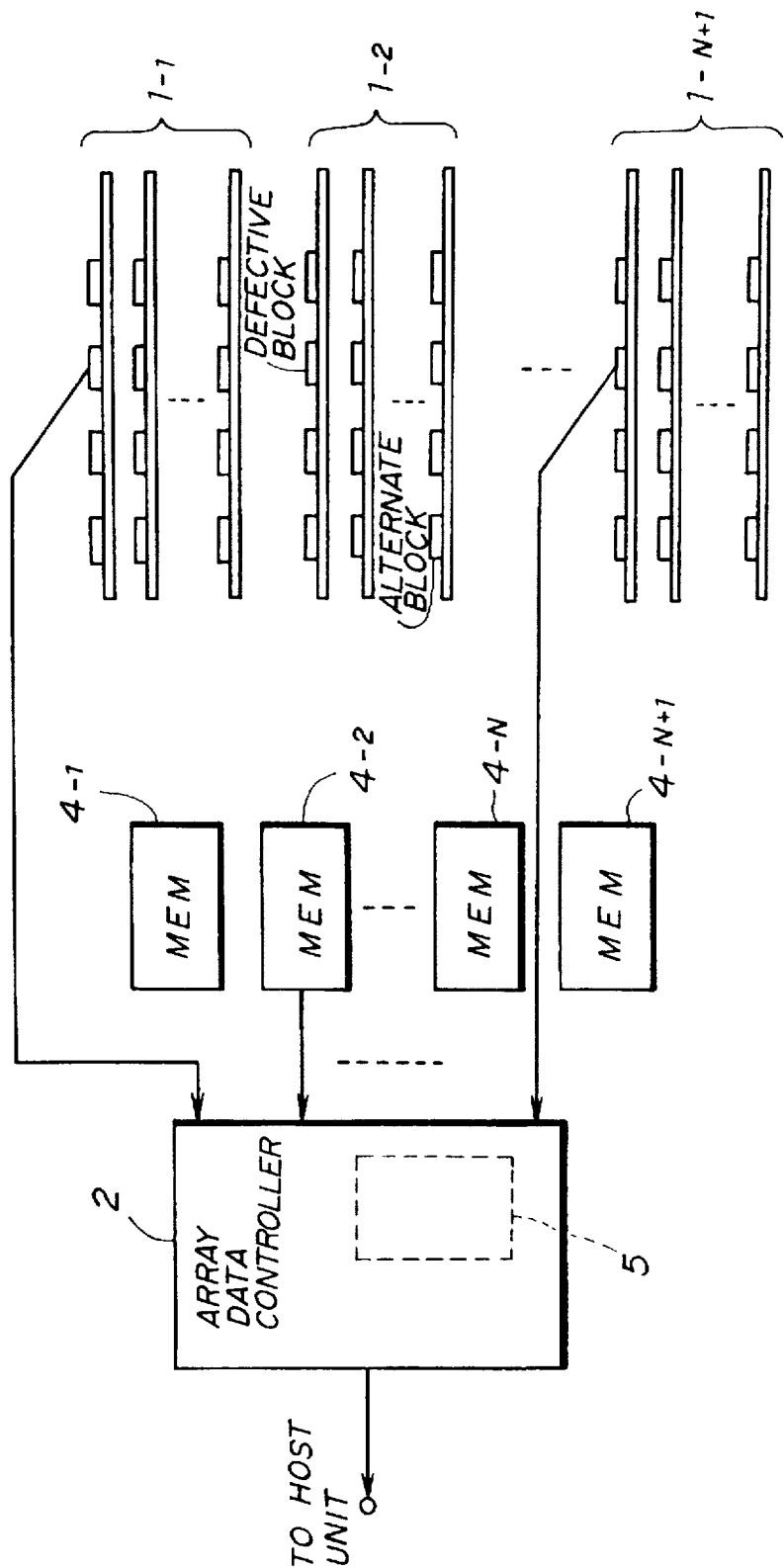
FIG. 5A is a system block diagram for explaining another aspect of the array disk system according to the present invention.

As shown in FIG. 5A, the array disk system includes the disk units 1-1 through 1-N+1, the array data controller 2 and the non-volatile memories 4-1 through 4-N+1 which are coupled as shown. The disk units 1-1 through 1-N are already written with the parallel data, and the disk unit 1-N+1 is already written with the parity data. The array data controller 2 includes a data restoration part 5 for restoring data not written in a defective block of a disk unit based on the parity data and the data written in other disk units. The non-volatile memories 4-1 through 4-N+1 are provided in correspondence with the disk units 1-1 through 1-N+1 for storing the data to be stored in defective blocks of the disk units 1-1 through 1-N+1. The array data controller 2 transmits the parallel data read from the disk units 1-1 through 1-N to the host unit (not shown) in the form of serial data.

FIG. 5B is a flow chart for explaining an operation of the array data controller 2 shown in FIG. 5A. When a read operation starts, a step ST11 judges whether or not a defective block exists on a recording surface of the disk unit 1-i from which data 1 is to be read out. When the judgement result in the step ST11 is NO, a step ST12 reads the data from the disk unit 1-i and the process ends.

On the other hand, when the judgement result in the step ST11 is YES, a step ST13 judges whether or not the data originally to be stored in the defective block is prestored in the non-volatile memory 4-i. When the judgement result in the step ST13 is YES, a step ST14 reads the data from the non-volatile memory 4-i. On the other hand, when the judgement result in the step ST13 is NO, a step ST15 restores the data not written in the defective block of the disk unit 1-i nor the corresponding non-volatile memory 4-i based on the parity data and the data written in other disk units. The process ends after the step ST14 or ST15.

The process shown in FIG. 5A is carried out for i=1, 2, . . . , N, N+1.

Accordingly, when the data originally to be written in the defective block of the disk unit is prestored in the non-volatile memory, the data can be read out from the non-volatile memory instead of from the alternate area of the disk unit. As a result, it is possible to reduce the time required to carry out the read operation. On the other hand, when the data originally to be written in the defective block of the disk unit is not prestored in the non-volatile memory, the data is restored from other data and parity data written in other disk units. For this reason, no time delay is introduced because there is no need to move the magnetic head to the alternate area of the disk unit, and the high-speed read operation of the array disk system will not be deteriorated by the alternate area assignment.

Next, a description will be given of an embodiment of the array disk system according to the present invention which employs an embodiment of a method of writing data in the array disk system according to the present invention.

Figure 1:
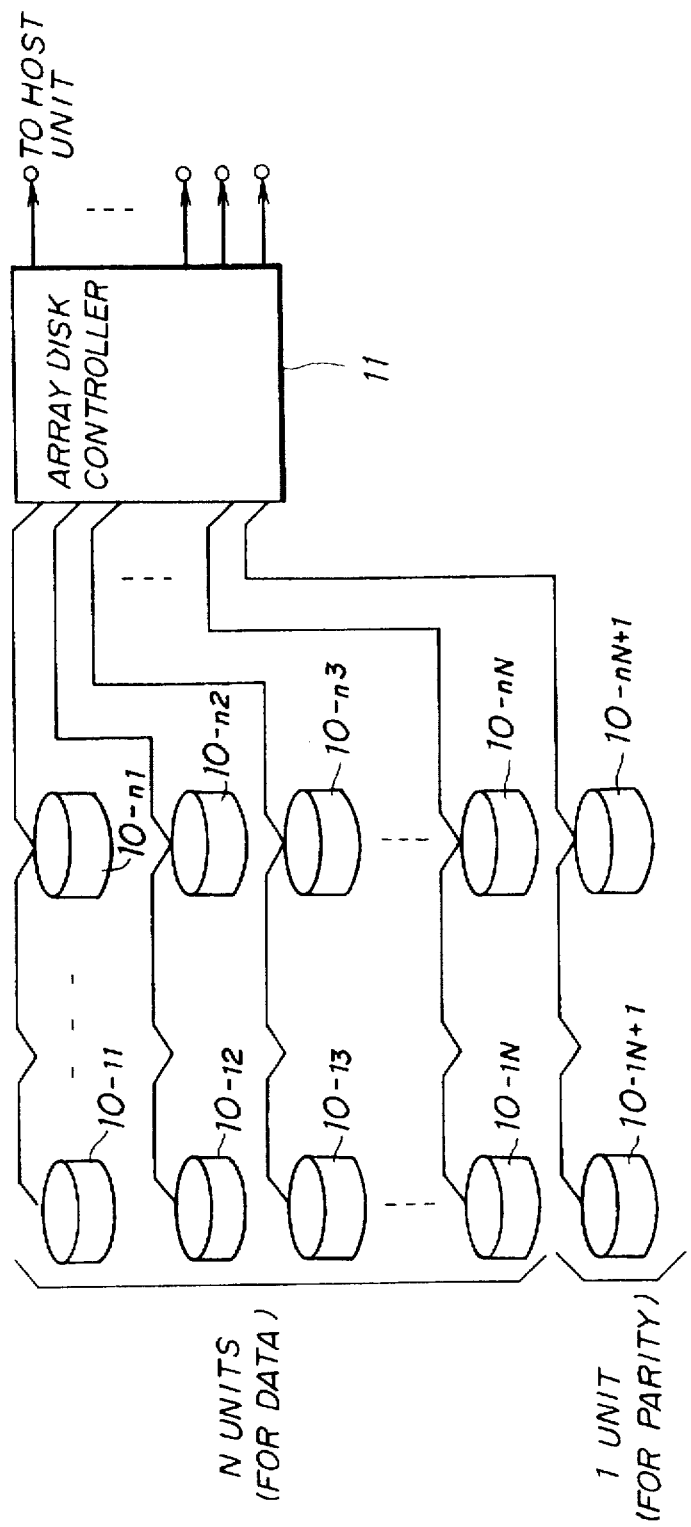
FIG. 1 is a system block diagram showing a previously proposed array disk system.
Figure 2:
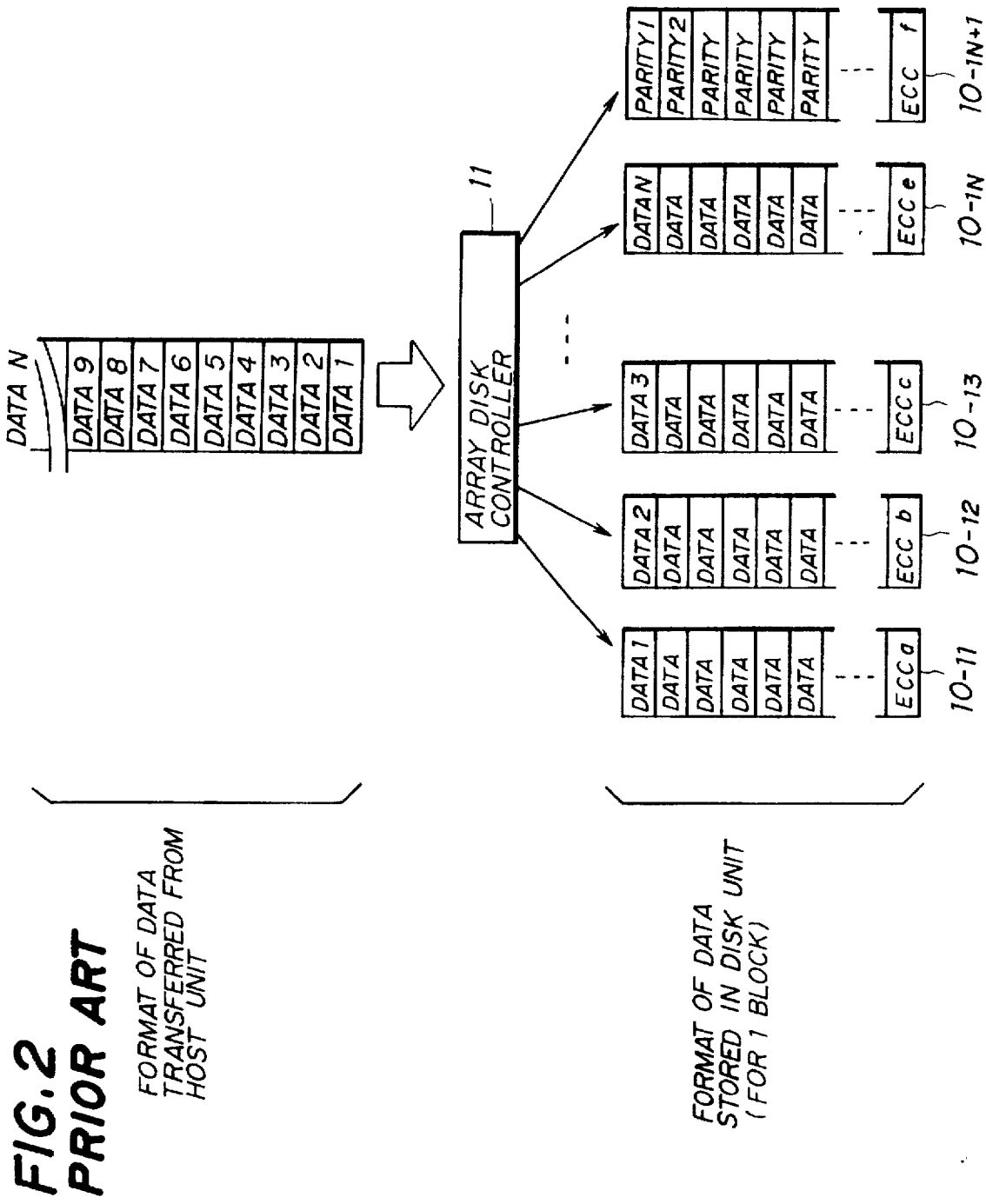
FIG. 2 is a diagram for explaining a write operation of the array disk system shown in FIG. 1.
Figure 3:
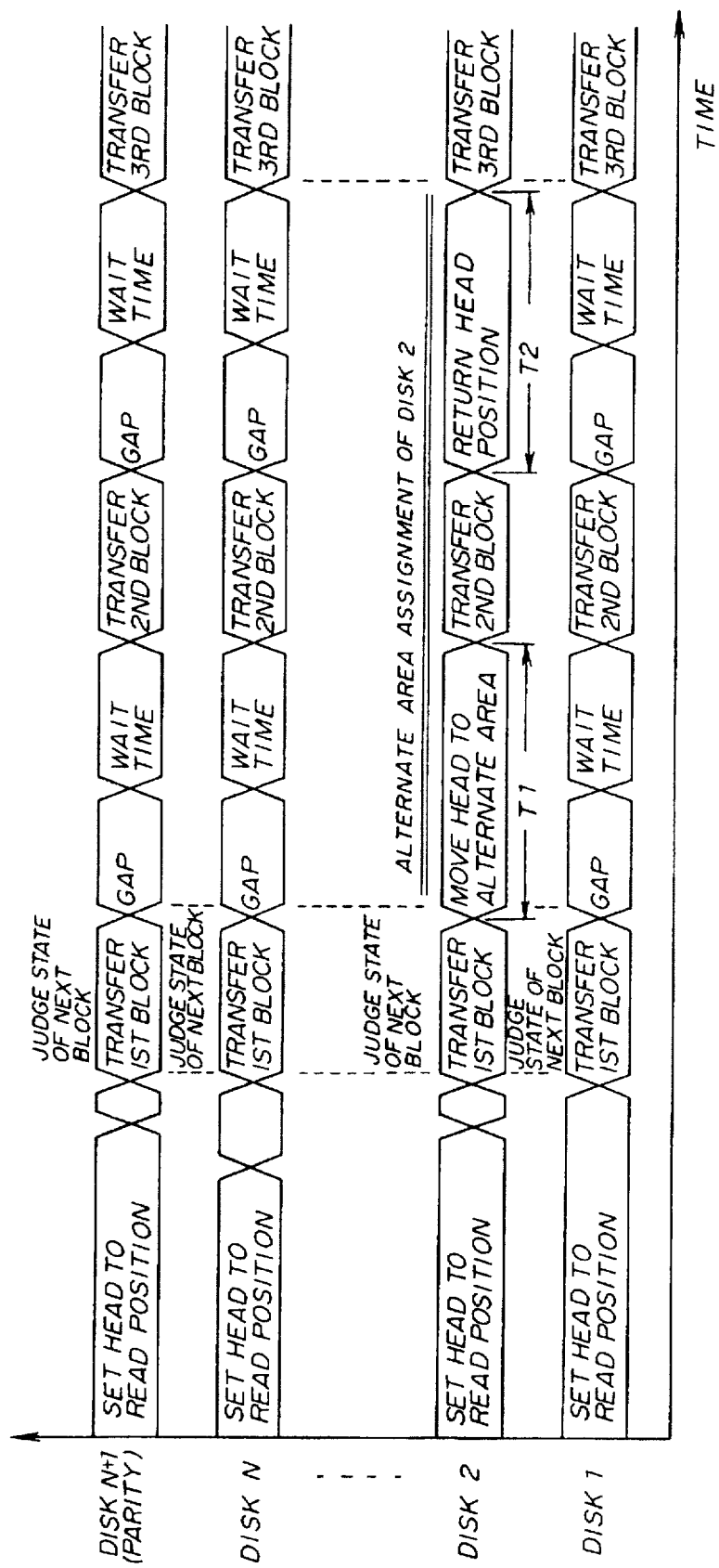
FIG. 3 is a time chart for explaining a read operation of the array disk system shown in FIG. 1 when making an alternate area assignment.
Figure 6:
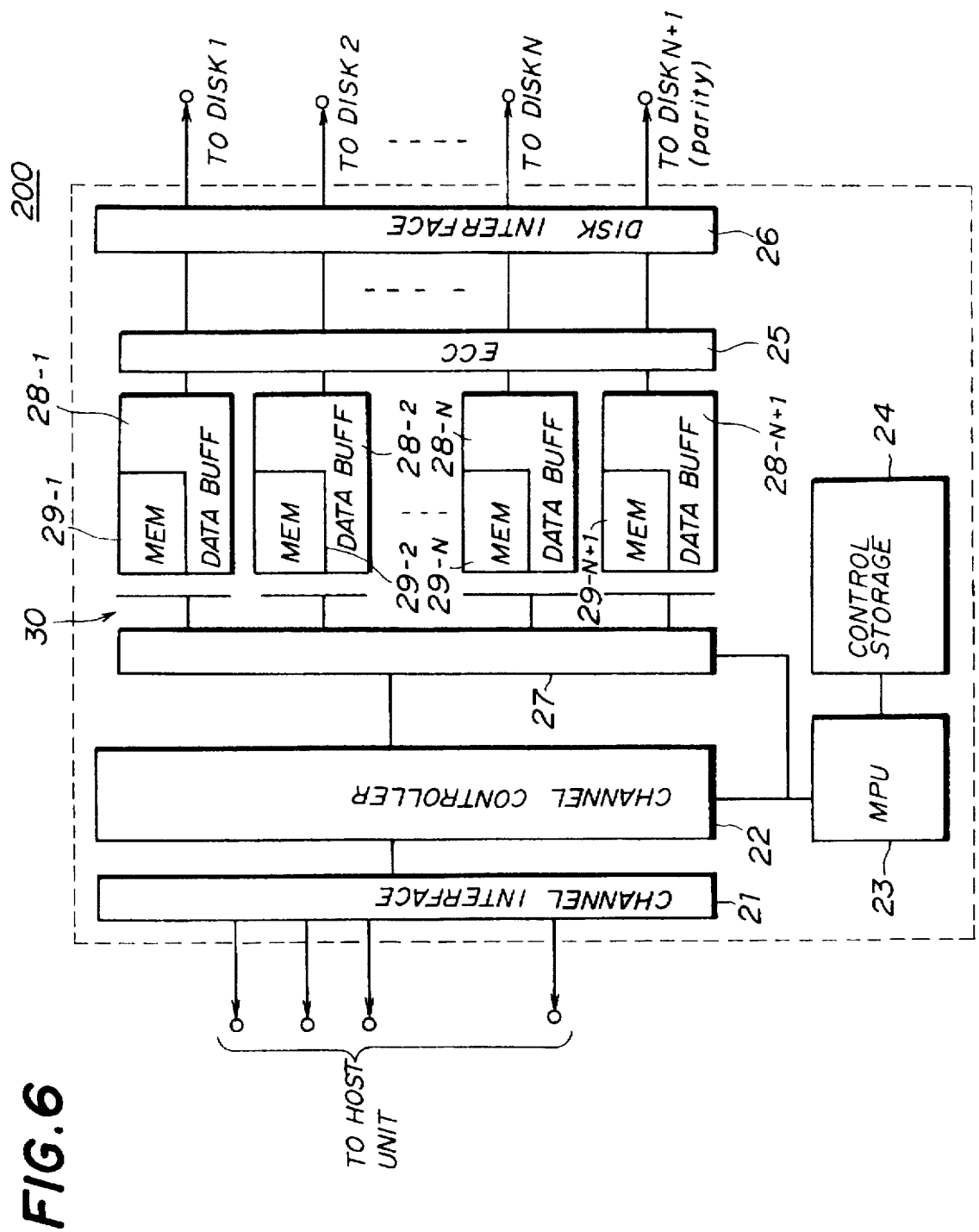
FIG. 6 is a system block diagram showing an essential part of an embodiment of the array disk system according to the present invention.

FIG. 6 shows an essential part of the embodiment of the array disk system. A director 200 shown in FIG. 6 is coupled to a plurality of input/output channels of a host unit (not shown) and a plurality of disk units DISK1 through DISKN+1 (not shown). The director 200 includes a channel interface circuit 21, a channel controller 22, a microprocessor unit (MPU) 23, a control storage 24, an error checking and correction (ECC) circuit 25, a disk interface circuit 26, a circuit 27 including a data correction and restoration part and a parity part, data buffers 28-1 through 28-N+1 respectively including non-volatile memories 29-1 through 29-N+1, and a multiplexer circuit 30 which are coupled as shown. The circuit 27 corresponds to the parity producing part 3 and the data restoration part 5 of the array data controller 2 shown in FIGS. 4A and 5A. The disk units DISK1 through DISKN are used for writing data, and the disk unit DISKN+1 is used for writing parity data. The disk units DISK1 through DISKN+1 respectively correspond to the disk units 1-1 through 1-N+1 shown in FIGS. 4A and 5A. Similarly as in the case of the array disk system shown in FIG. 1, the director 200 converts serial data from the host unit into parallel data and writes the parallel data into the N disk units DISK1 through DISKN simultaneously.

The MPU 23 controls the entire operation of the director 200, and the control storage 24 stores programs of the MPU 23. The disk interface circuit 26 supplies the data from the ECC circuit 25 to the disk units DISK1 through DISKN and supplies the parity data to the disk unit DISKN+1. The circuit 27 produces the parity data in the parity part and corrects and restores the data of a defective block in the data correction and restoration part based on the parity data. The data buffers 28-1 through 28-N+1 are provided in correspondence with the disk units DISK1 through DISKN+1. The ECC circuit 25 checks and corrects the error of the data based on ECC data which are added to the data.

Figure 7:
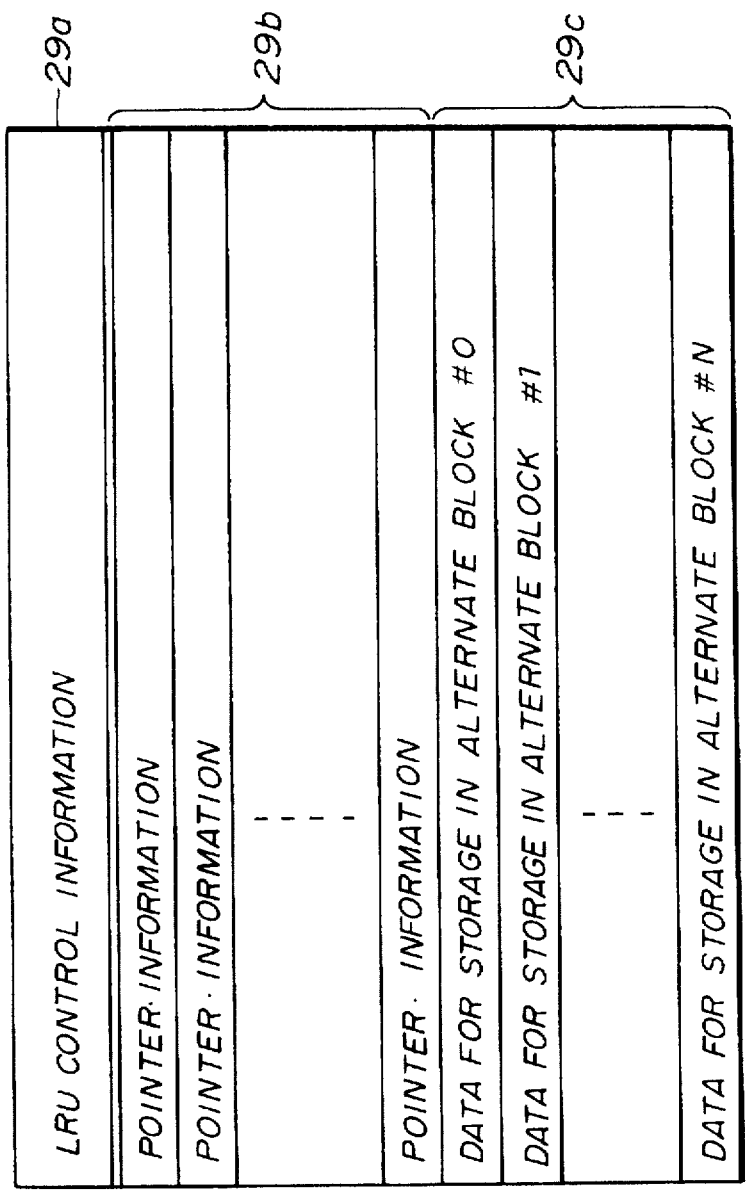
FIG. 7 is a diagram for explaining contents of a non-volatile memory shown in FIG. 6.

The non-volatile memories 29-1 through 29-N+1 employ the least recently used (LRU) system. As shown in FIG. 7, the non-volatile memory 29-i (i=1, 2, . . . , N+1) includes an LRU information storage area 29a, a pointer storage area 29b and a data storage area 29c. The LRU information storage area 29a stores the LRU information. The pointer storage area 29b stores pointer information related to a disk number, a defective block number and an alternate block number. The data storage area 29c stores the data to be stored in the alternate block.

Figure 8:
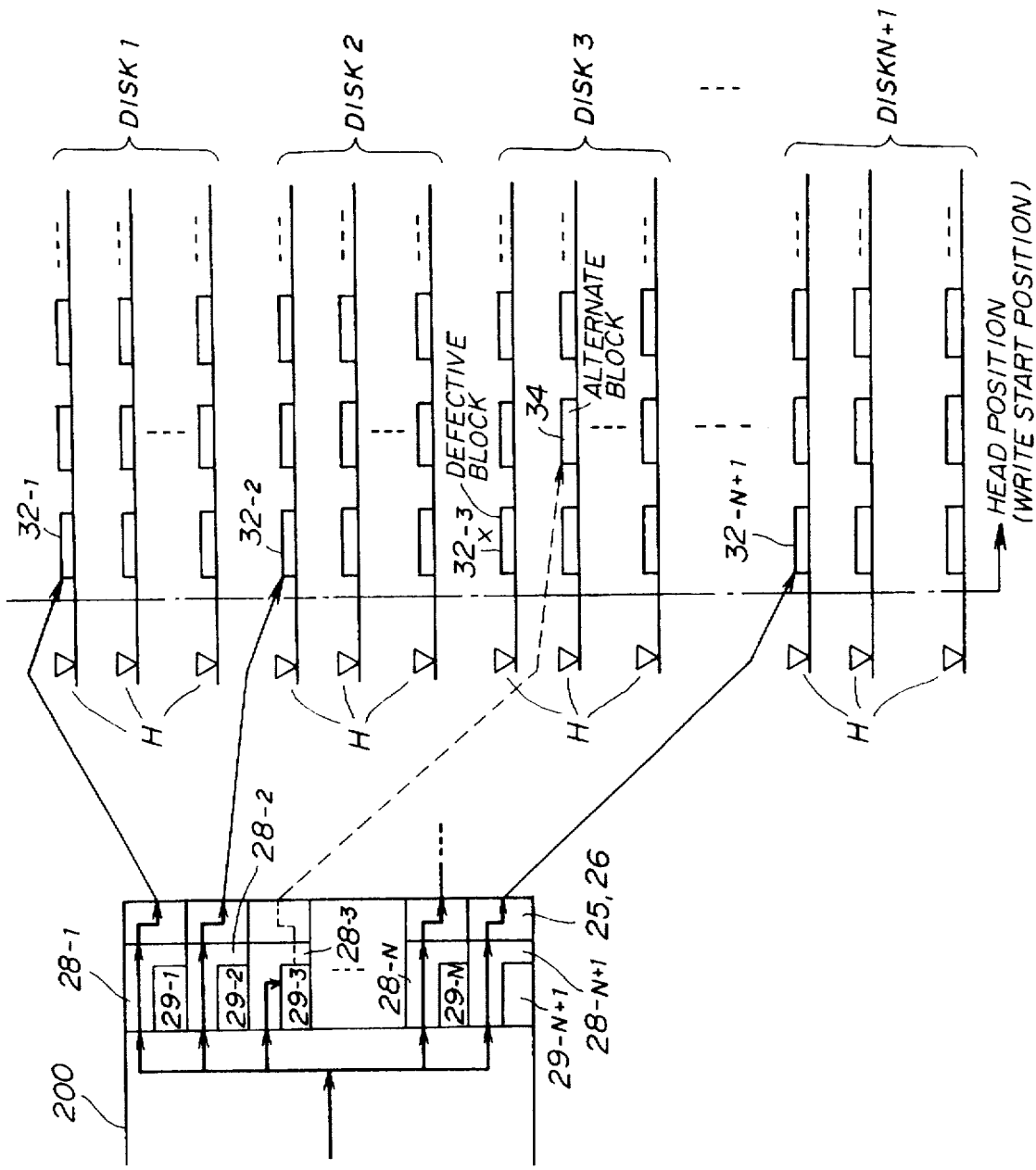
FIG. 8 is a system block diagram showing an essential part of the embodiment for explaining a write operation.

A write operation of the embodiment will now be described with reference to FIGS. 8 through 10. FIG. 8 shows only a part of the system shown in FIG. 6 essential to explain the write operation. For the sake of convenience, it is assumed that data are to be written in blocks 32-1 through 32-N+1 of the respective disk units DISK1 through DISKN+1.

Figure 9:
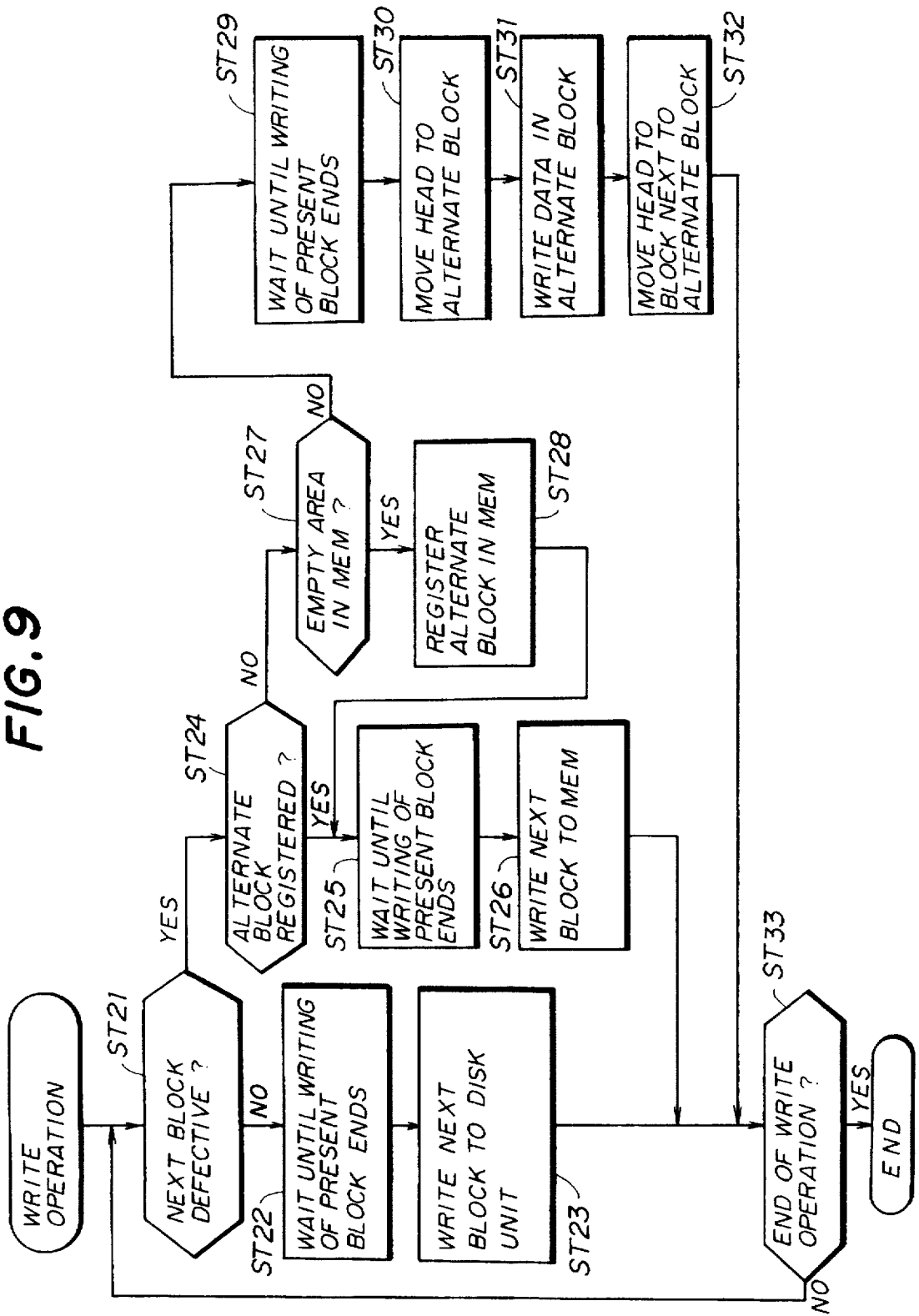
FIG. 9 is a flow chart for explaining the write operation.

When the write operation starts in FIG. 9, a step ST21 judges whether or not a next block of the disk unit DISKi is a defective block. When the judgement result in the step ST21 is NO, a step ST22 waits until the writing of data to a present block of the disk unit DISKi ends, and a step ST23 writes the data to the next block.

On the other hand, when the judgement result in the step ST21 is YES, a step ST24 judges whether or not an alternate block of the disk unit DISKi is already registered in the non-volatile memory 29-i. When the judgement result in the step ST24 is YES, a step ST25 waits until the writing of data to the present block ends, and a step ST26 writes the data to the alternate block of the disk unit DISKi.

FIG. 8 shows a case where the block 32-3 of the disk unit DISK3 is defective and the solid line indicates a state where the data intended for the defective block 32-3 is stored in the non-volatile memory 29-3. The other blocks 32-1, 32-2 and 32-4 through 32-N+1 are not defective and the data intended therefor are normally written into these blocks.

When the judgement result in the step ST24 is NO, a step ST27 judges whether or not an empty area exists in the non-volatile memory 29-i. When the judgement result in the step ST27 is YES, a step ST28 registers the alternate block of the disk unit DISKi into the non-volatile memory 29-i and the process advances to the step ST25 described above.

On the other hand, when the judgement result in the step ST27 is NO, a step ST29 waits until the writing of data to the present block of the disk unit DISKi ends. Then, a step ST30 moves a magnetic head H to the alternate block of the disk unit DISKi and a step ST31 writes the data intended for the defective block into the alternate block of the disk unit DISKi, a step ST32 moves the magnetic head H to a block next to the defective block.

After the steps ST23, ST26 and ST32, a step ST33 judges whether or not the write operation is to be ended, that is, there is no more data to be written. The process ends when the judgement result in the step ST33 is YES, but the process returns to the step ST21 when the judgement result in the step ST33 is NO.

The process shown in FIG. 9 is carried out for i=1, 2, . . . , N+1.

Figure 10:
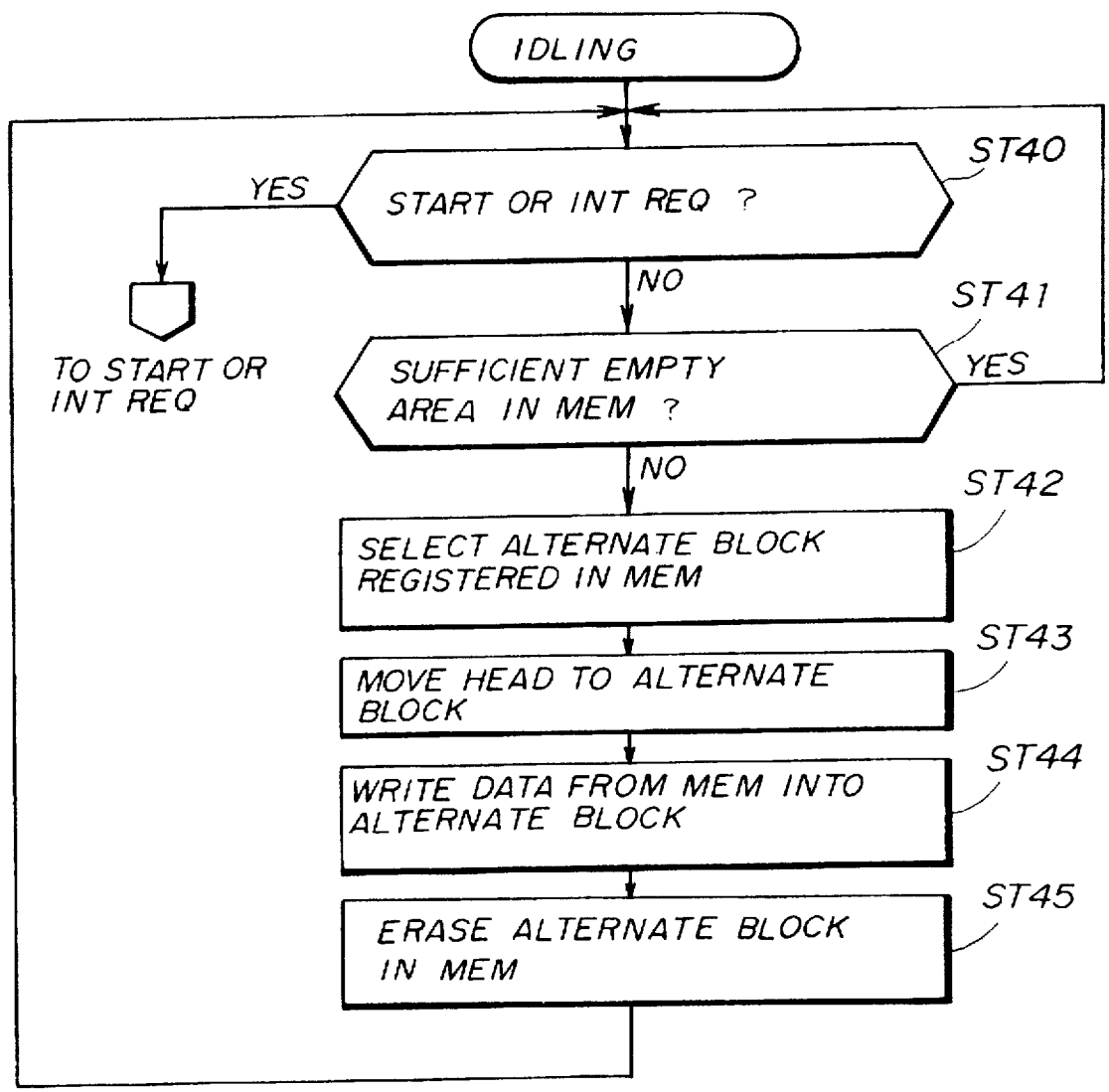
FIG. 10 is a flow chart for explaining the write operation to an alternate block of a disk unit.

FIG. 10 shows a routine which is carried out after the alternate block is written in the non-volatile memory 29-i and the MPU 23 is in an idling state. A step ST40 judges whether or not a start request from a high order unit or an interrupt request from a disk unit is received. The start or interrupt process is carried out when the judgement result in the step ST40 is YES. But when the judgement result in the step ST40 is NO, a step ST41 judges whether or not a sufficient empty area exists in the non-volatile memory 29-i. The process returns to the step ST40 when the judgement result in the step ST41 is YES.

On the other hand, when the judgement result in the step ST41 becomes NO, a step ST42 selects an alternate block which is registered in the non-volatile memory 29-i, and a step ST43 moves the magnetic head H to the alternate block of the concerned disk unit DISKi. Then, a step ST44 writes the data contents of the selected alternate block stored in the non-volatile memory 29-i into the alternate block of the disk unit DISKi, and a step ST45 erases the selected alternate block registered in the non-volatile memory 29-i so as to make available (empty) area in the non-volatile memory 29-i. The process returns to the step ST40 after the step ST45.

FIG. 8 shows a case where the contents of the non-volatile memory 29-3 is written into an alternate block 34 of the disk unit DISK3, as indicated by a phantom line.

Accordingly, even when the disk unit includes a defective block, no writing of data is made to the alternate block of the disk unit during the write operation with respect to the disk unit. For this reason, there is no need to move the magnetic head to the alternate block during the write operation. There is no need to return the magnetic head from the alternate block to the next block after the writing of the data, since the writing of data to the alternate block does not take place during the write operation with respect to the disk unit. Therefore, the data can be written into the disk units at a high speed even when the alternate block assignment is made.

Figure 11:
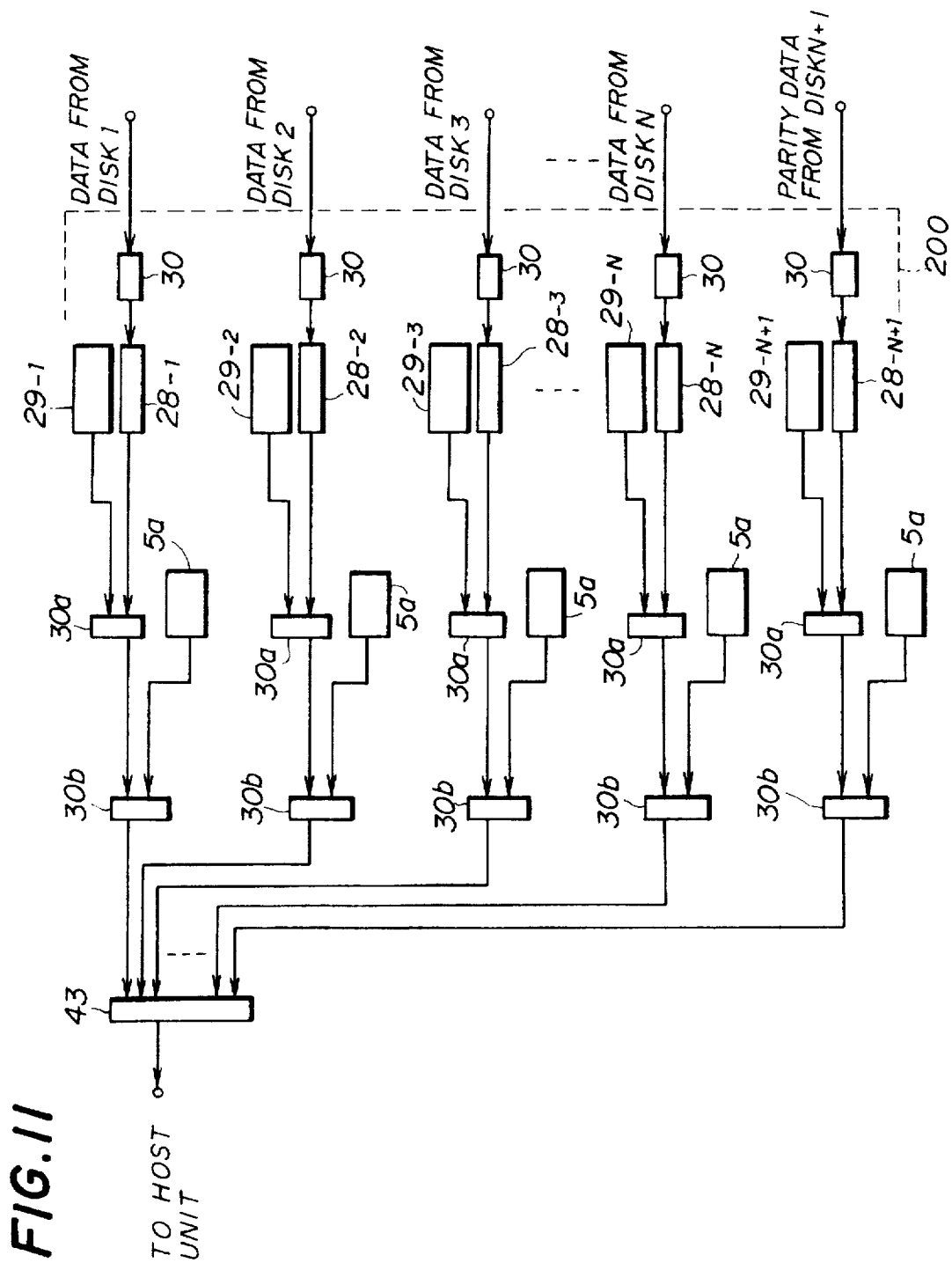
FIG. 11 is a system block diagram showing an essential part of the embodiment for explaining a read operation.

Next, a read operation of the embodiment will be described with reference to FIGS. 11 through 14. FIG. 11 shows only a part of the system shown in FIG. 6 essential to explain the read operation.

The data read from the disk unit DISKi is supplied to the disk interface circuit 30 of the director 200. In FIG. 11, multiplexer parts 30a and 30b form the multiplexer 30 shown in FIG. 6. In addition, data restoration circuits 5a form the data restoration part 5. The circuit 27 shown in FIG. 6 includes the data restoration circuits 5a, the multiplexers 30a and 30b, and a buffer register 43.

Figure 12:
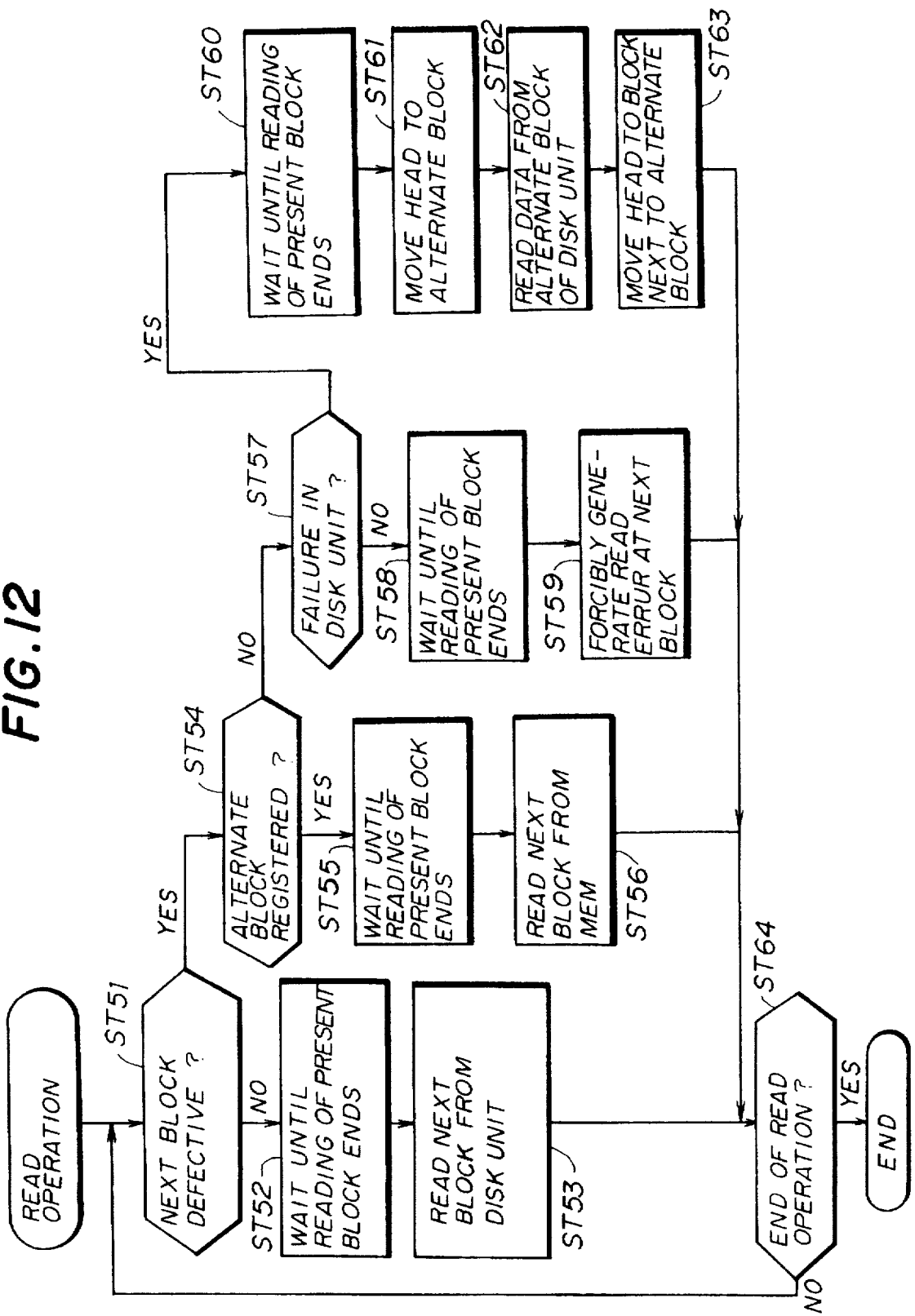
FIG. 12 is a flow chart for explaining the read operation.
Figure 13:
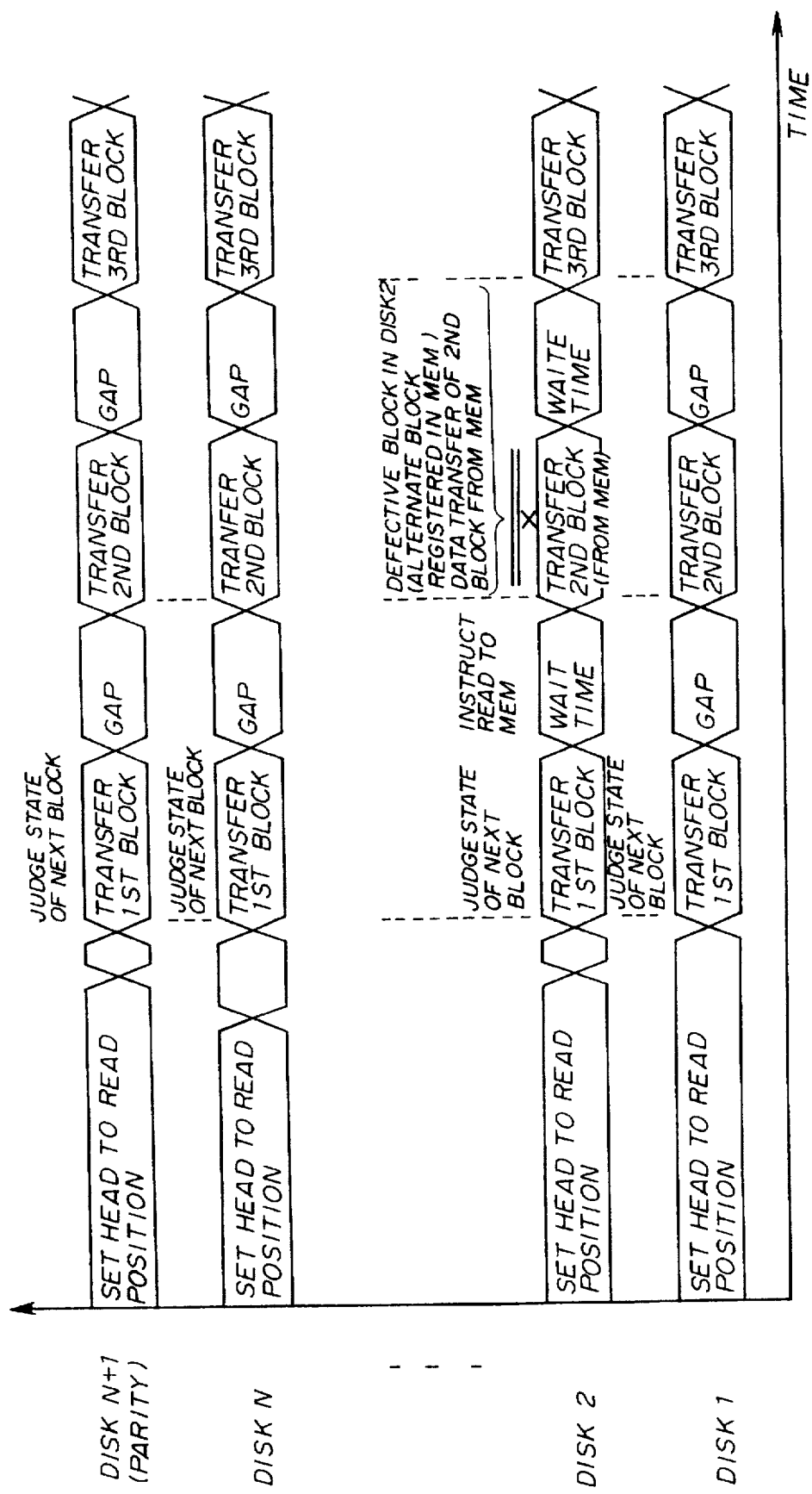
FIG. 13 is a time chart for explaining the read operation when a defective block is already registered in a non-volatile memory.

When a read operation starts in FIG. 12, a step ST51 judges whether or not a next block of the disk unit DISKi to be read is a defective block. When the judgement result in the step ST51 is NO, a step ST52 waits until the reading of data from a present block of the disk unit DISKi ends, and a step ST53 reads out the data of the next block from the disk unit DISKi.

On the other hand, when the judgement result in the step ST51 is YES, a step ST54 judges whether or not an alternate block is already registered in the non-volatile memory 29-i. When the judgement result in the step ST54 is YES, a step ST55 waits until the reading of data from the present block of the disk unit DISKi ends, and a step ST56 reads the data of the next block from the non-volatile memory 29-i.

Figure 14:
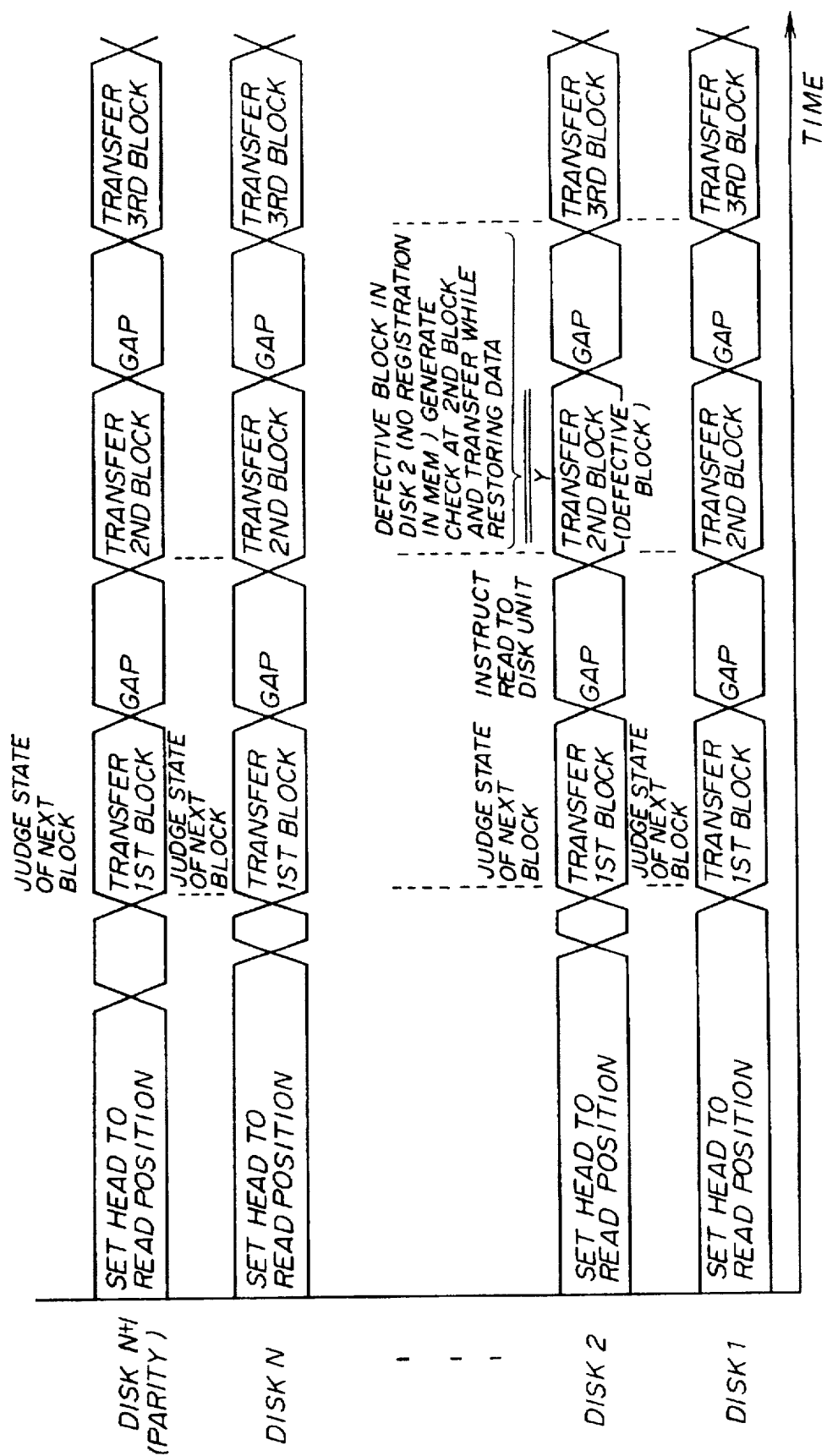
FIG. 14 is a time chart for explaining the read operation when a defective block is not registered in the non-volatile memory.

FIG. 14 is a flow chart for explaining the read operation. In FIG. 14, it is assumed for the sake of convenience that a second block of the disk unit DISK2 is a defective block and the alternate block therefor is not registered in the non-volatile memory 29-2. A mark Y in FIG. 14 indicates the transfer of this defective block while restoring the data of the defective block from the data and parity data read from the other disk units DISK1 and DISK3 through DISKN+1.

When the judgement result in the step ST54 is NO, a step ST57 judges whether or not a failure exists in the disk units other than the disk unit DISKi. When the judgement result in the step ST57 is NO, a step ST58 waits until the reading of data from the present block of the disk unit DISKi ends. Then, a step ST59 forcibly generates a read error at the next block, and restores the data of this defective block in the data restoration part 5 based on the data and parity data from the disk units other than the disk unit DISKi.

FIG. 14 is a flow chart for explaining the read operation. In FIG. 14, it is assumed for the sake of convenience that a second block of the disk unit DISK2 is a defective block but the alternate block therefor is already registered in the non-volatile memory 29-2. A mark X in FIG. 13 indicates the transfer of this defective block from the non-volatile memory 29-2.

When the judgement result in the step ST57 is YES, a step ST60 waits until the reading of data from the present block of the disk unit DISKi ends. A step ST61 moves the magnetic head to the alternate block of the disk unit DISKi, and a step ST62 reads the data from the alternate block of the disk unit DISKi. A step ST63 moves the magnetic head from the alternate block to a next block of the disk unit DISKi.

After the steps ST53, ST56, ST59 and ST63, a step ST64 judges whether or not the read operation is to be ended, that is, there is no more data to be read. The process ends when the judgement result in the step ST64 is YES, but the process returns to the step ST51 when the judgement result in the step ST64 is NO.

The process shown in FIG. 12 is carried out for i=1, 2, . . . , N+1.

Accordingly, it is possible to reduce the read-out time when reading the data from the disk unit because the data is read from the non-volatile memory and not the disk unit when the necessary data related to the defective block is prestored in the non-volatile memory. In addition, even when the necessary data related to the defective block is not prestored in the non-volatile memory, the data is not read from the alternate block of the disk unit when no failure exists in the disk units, and there is no need to move the magnetic head to the alternate block. Instead, the data of the defective block is restored based on the data and parity data read from other disk units. Therefore, the data can be read from the disk units at a high speed even when the alternate block assignment is made.

In the described embodiment, the magnetic disk units are coupled in parallel in the array disk system. However, the present invention is of course applicable to other array disk systems such as a system which includes a plurality of optical disk units coupled in parallel.

In addition, it should be noted that each disk unit actually includes a plurality of disks which are coaxially arranged, and a magnetic head is provided with respect to each recording surface of each disk. Hence, an alternate block for a defective block existing on one recording surface of one disk does not necessarily have to be provided on the same recording surface or the same disk.

Moreover, it is of course not essential that a plurality of non-volatile memories are provided in correspondence with the disk units. For example, mutually different memory areas of a single non-volatile memory may be allocated in correspondence with the disk units.

Further, the present invention is not limited to these embodiments, but various variations and modifications may be made without departing from the scope of the present invention.

What is claimed is:

1. An array disk system, comprising:

a plurality of disk units each having at least a portion for receiving thereon stored data and at least a portion for writing data thereon, each of said disk units having a recording surface which includes an alternate block when a defective block exists thereon;

control means supplied with data for controlling writing heads in which the data are simultaneously written to said disk units, said disk units being coupled to said control means in parallel, the data to be written into each of said disk units being comprised of a plurality of data blocks; and memory means coupled to said control means for storing a data block to be written into the defective block of each of said disk units, wherein said control means controls the writing of the data into blocks of said disk units when said disk units are free of defective blocks, wherein said control means, when it is determined that in the controlling of the writing heads the data to be written into each of said disk units includes a data block to be written into the defective block of the one of said disk units, stores into said memory means the data block to be written into the defective block, and thereafter controls to continue the writing of the remaining data blocks of the data into the recording blocks of said disk units, without controlling, during the control of the writing heads for writing the data including a data block to be written into the defective block of the one of said disk units, writing of the data blocks which have been stored into said memory means into an alternate block of the one of said disk units.

2. The array disk system as claimed in claim 1, wherein said control means receives the data in a serial form and includes means for converting the data into a parallel form, said data in the parallel form being written into said disk units.

3. The array disk system as claimed in claim 1, wherein said memory means includes a plurality of non-volatile memories which are provided in correspondence with said disk units.

4. The array disk system as claimed in claim 1, wherein said control means further includes detecting means for detecting whether or not an empty area exists in said memory means for storing the data related to said defective block prior to storage thereof.

5. The array disk system as claimed in claim 4, wherein said control means further controls the writing of data related to an arbitrary defective block and prestored in said memory means into the alternate block of a corresponding one of said disk units when said detecting means detects no empty area in said memory means prior to storing the data related to said defective block into said memory means.

6. The array disk system as claimed in claim 5, wherein said control means further includes erasing means for erasing the data related to said arbitrary defective block from said memory means after writing the same into said corresponding disk unit.

7. A method of writing data in parallel in an array disk system which includes a plurality of disk units respectively having at least a portion for receiving thereon stored data and at least a portion for writing data thereon, said disk having a recording surface which includes an alternate block when a defective block exists thereon, said method comprising the steps of:

controlling by a control unit a writing of the data into blocks of said disk units when said disk units are free of defective blocks, the data to be written into each of said disk units being comprised of a plurality of data blocks; and controlling by said control unit, when it is determined that in the controlling of the writing the data to be written into each of said disk units includes a data block to be written into the defective block of the one of said disk units, to store into a memory means the data block to be written into the defective block, and thereafter controlling to continue the writing of the remaining data blocks of the data into the recording blocks of said disk units, without controlling, during the control of the writing of the data including a data block to be written into the defective block of the one of said disk units, writing of the data blocks which have been stored into said memory means into an alternate block of the one of said disk units.

8. The method as claimed in claim 7, further comprising the step of converting data received in a serial form into a parallel form, so that said data in the parallel form are written into said disk units.

9. The method as claimed in claim 7 wherein said memory means includes a plurality of non-volatile memories which are provided in correspondence with said disk units.

10. The method as claimed in claim 7, further comprising the step of detecting by a detecting means whether or not an empty area exists in said memory means for storing the data related to said defective block prior to storage thereof.

11. The method as claimed in claim 10, further comprising the step of controlling by said control unit a writing of data related to an arbitrary defective block and prestored in said memory means into the alternate block of a corresponding one of said disk units when said detecting means detects no empty area in said memory means prior to storing the data related to said defective block into said memory means.

12. The method as claimed in claim 11, further comprising the step of erasing the data related to said arbitrary defective block from said memory means after writing the same into said corresponding disk unit.

13. An array disk apparatus, comprising:

a plurality of storage devices;

a non-volatile memory;

an array controller to control said plurality of storage devices such that a redundant data is stored in one of the plurality of storage devices; and means for controlling a writing operation of writing the data to be written into each of disk units, the data to be written into each of said disk units being comprised of a plurality of data blocks, and for controlling a storage of data into said non-volatile memory when one of said plurality of storage devices has a defective block in which said data is to be stored, wherein said means for controlling, when it is determined that in the controlling of the writing the data to be written into each of said disk units includes a data block to be written into the defective block of the one of said disk units, stores into a memory means the data block to be written into the defective block, and thereafter controls to continue the writing of the remaining data blocks of the data into the recording blocks of said disk units, without controlling, during the control of the writing for writing the data including a data block to be written into the defective block of the one of said disk units, writing of the data blocks which have been stored into said memory means into an alternate block of the one of said disk units.

14. The array disk apparatus as claimed in claim 13, wherein said control means reads out said data from said non-volatile memory and writes read-out data in an alternate block in said one of said plurality of storage devices during a free time of said array controller.

15. The array disk apparatus as claimed in claim 13, further comprising means for reading out said data from said non-volatile memory and for transferring said read-out data to a host computer which is coupled to said array disk apparatus and requested to read out said data.

16. The array disk apparatus as claimed in claim 13, wherein said non-volatile memory includes a plurality of non-volatile memories which are provided in correspondence with said plurality of storage devices.

17. The array disk apparatus as claimed in claim 13, wherein said non-volatile memory prestores data originally intended to be written in said defective block of said one of said plurality of storage devices.

18. The array disk apparatus as claimed in claim 17, wherein said control means reads data of said defective block of said one of said plurality of storage devices from said non-volatile memory when said data of said defective block is prestored in said non-volatile memory.

19. An array disk system comprising:

a plurality of disk units, one of which stores a redundant data for the data stored in the remaining disk units, and each of said disk units having a recording surface which includes an alternate block for a defective block thereon;

control means for controlling a writing operation of writing the data to be written into each of said disk units, said disk units being coupled to said control means in parallel, the data to be written into each of said disk units being comprised of a plurality of data blocks; and memory means coupled to said control means for storing a data block to be written into the defective block of one of said disk units, wherein said control means, when it is determined that in the writing operation the data block to be written into each of said disk units includes a data block to be written into the defective block of the one of said disk units, stores into said memory means the data block to be written into the defective block, and thereafter controls to continue the writing of the remaining data blocks of the data into the recording blocks of said disk units, without controlling, during the writing operation of the data including a data block to be written into the defective block of the one of said disk units, writing of the data blocks which have been stored into said memory means into an alternate block of the one of said disk units.

20. A method of writing data in an array disk system which comprises a plurality of disk units, one of which stores a redundant data for the data stored in the remaining disk units, and each of said disk units having a recording surface which includes an alternate block for a defective block thereon, said method comprising the steps of:

controlling a writing operation of writing the data to be written into each of said disk units by control means, said disk units being coupled to said control means in parallel, the data to be written into each of said disk units being comprised of a plurality of data blocks;

when it is determined that in the writing operation of the data to be written into each of said disk units includes a data block to be written into the defective block of the one of said disk units, stores into memory means other than that of the disk unit the data block to be written into the defective block, and thereafter controls to continue the writing of the remaining data blocks of the data into the recording blocks of said disk units, without controlling, during the writing operation of the data including a data block to be written into the defective block of the one of said disk units, writing of the data blocks which have been stored into said memory means into an alternate block of the one of said disk units.

21. An array disk system, comprising:

a plurality of disk units each having at least a portion for receiving thereon stored data and at least a portion for successively writing first, second and third data thereon, each of said disk units having a recording surface which includes an alternate block when a defective block exists thereon;

control means supplied with first, second and third data for controlling writing heads in which the first, second and third data are successively written to said disk units, said disk units being coupled to said control means in parallel, the first, second and third data to be successively written into each of said disk units being comprised of a plurality of data blocks; and memory means coupled to said control means for storing a data block to be written into the defective block of each of said disk units, wherein said control means controls the writing of the data into blocks of said disk units when said disk units are free of defective blocks, wherein said control means, when it is determined that in the controlling of the writing heads the third data to be written into each of said disk units includes a data block to be written into the defective block of the one of said disk units, stores into said memory means the data block to be written into the defective block, and thereafter controls to continue the writing of any remaining data blocks of the data into the recording blocks of said disk units, without controlling, during the control of the writing heads for writing the third data including a data block to be written into the defective block of the one of said disk units, writing of the data blocks which have been stored into said memory means into an alternate block of the one of said disk units.

22. A method of writing data in parallel in an array disk system which includes a plurality of disk units respectively having at least a portion for receiving thereon stored data and at least a portion for successively writing first, second and third data thereon, said disk having a recording surface which includes an alternate block when a defective block exists thereon, said method comprising the steps of:

controlling by a control unit a writing of the data into blocks of said disk units when said disk units are free of defective blocks, the data to be written into each of said disk units being comprised of a plurality of data blocks; and controlling by said control unit, when it is determined that in the controlling of the writing the third data to be written into each of said disk units includes a data block to be written into the defective block of the one of said disk units, to store into a memory means the data block to be written into the defective block, and thereafter controlling to continue the writing of the remaining data blocks of the data into the recording blocks of said disk units, without controlling, during the control of the writing of the third data including a data block to be written into the defective block of the one of said disk units, writing of the data blocks which have been stored into said memory means into an alternate block of the one of said disk units.

23. An array disk apparatus, comprising:

a plurality of storage devices;

a non-volatile memory;

an array controller to control said plurality of storage devices such that a redundant data is stored in one of the plurality of storage devices; and means for controlling a writing operation of successively writing first, second and third data to be written into each of disk units, the data to be written into each of said disk units being comprised of a plurality of data blocks, and for controlling a storage of data into said non-volatile memory when one of said plurality of storage devices has a defective block in which said data is to be stored, wherein said means for controlling, when it is determined that in the controlling of the writing the third data to be written into each of said disk units includes a data block to be written into the defective block of the one of said disk units, stores into a memory means the data block to be written into the defective block, and thereafter controls to continue the writing of the remaining data blocks of the data into the recording blocks of said disk units, without controlling, during the control of the writing for writing the third data including a data block to be written into the defective block of the one of said disk units, writing of the data blocks which have been stored into said memory means into an alternate block of the one of said disk units.

* * * * *

UNITED STATES PATENT AND TRADEMARK OFFICE
CERTIFICATE OF CORRECTION

PATENT NO. : 5,793,727
DATED : August 11, 1998
INVENTOR(S) : Kazuhiko Ishibashi et al.

It is certified that error appears in the above-identified patent and that said Letters Patent is hereby corrected as shown below: On the title page, Item [75] Inventors, should be corrected as follows:

--Kazuhiko Ishibashi, Yokohama; Tomohisa Ohyama, Sagamihara, both of Japan--

Signed and Sealed this

Twenty-second Day of June, 1999

*Attest:*

Q. TODD DICKINSON

*Attesting Officer*      *Acting Commissioner of Patents and Trademarks*

UNITED STATES PATENT AND TRADEMARK OFFICE
CERTIFICATE OF CORRECTION

PATENT NO. : 5,793,727
DATED : August 11, 1998
INVENTOR(S) : Kazuhiko Ishibashi et al.

It is certified that error appears in the above-identified patent and that said Letters Patent is hereby corrected as shown below:

On the title page:

Item [73] Assignees, should be corrected as follows:

--Fujitsu Limited, Kawasaki, Japan--.

Signed and Sealed this

Seventeenth Day of August, 1999

Attest:

Q. TODD DICKINSON

*Attesting Officer*    *Acting Commissioner of Patents and Trademarks*